United States Patent
Tohoda et al.

(10) Patent No.: US 9,991,404 B2
(45) Date of Patent: Jun. 5, 2018

(54) SOLAR CELL MODULE AND SOLAR CELL MODULE MANUFACTURING METHOD

(71) Applicant: Panasonic Intellectual Property Management Co., Ltd., Osaka (JP)

(72) Inventors: Satoshi Tohoda, Osaka (JP); Shigeharu Taira, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 18 days.

(21) Appl. No.: 15/064,164

(22) Filed: Mar. 8, 2016

(65) Prior Publication Data

US 2016/0190356 A1   Jun. 30, 2016

Related U.S. Application Data

(63) Continuation of application No. PCT/JP2014/003954, filed on Jul. 28, 2014.

(30) Foreign Application Priority Data

Sep. 30, 2013 (JP) ................................. 2013-204127

(51) Int. Cl.
*H01L 31/0232* (2014.01)
*H01L 31/0216* (2014.01)
(Continued)

(52) U.S. Cl.
CPC .... *H01L 31/02327* (2013.01); *H01L 31/0203* (2013.01); *H01L 31/0216* (2013.01);
(Continued)

(58) Field of Classification Search
CPC ............. H01L 31/02327; H01L 31/054; H01L 31/0547; H01L 31/18; B41F 15/00
See application file for complete search history.

(56) References Cited

U.S. PATENT DOCUMENTS

| | | | |
|---|---|---|---|
| 2002/0185170 A1 | 12/2002 | Shiotsuka et al. | |
| 2005/0016580 A1* | 1/2005 | Haga | ..................... H01L 31/048 |
| | | | 136/244 |
| 2010/0147363 A1* | 6/2010 | Huang | .............. B32B 17/10009 |
| | | | 136/251 |

FOREIGN PATENT DOCUMENTS

| | | |
|---|---|---|
| JP | S57-12567 A | 1/1982 |
| JP | 2009-147363 A | 7/2009 |

OTHER PUBLICATIONS

International Search Report dated Aug. 19, 2014, issued in corresponding International Application No. PCT/JP2014/003954. (w/ English translation).

* cited by examiner

*Primary Examiner* — Tae-Sik Kang
(74) *Attorney, Agent, or Firm* — McDermott Will & Emery LLP

(57) ABSTRACT

A solar cell module manufacturing method is provided. This method includes: preparing a solar cell element that has a surface whose outer periphery is surrounded by a plurality of sides, an encapsulant that seals the solar cell elements, and a coating that has light diffusivity; applying the coating in an outer peripheral area of the surface via a printing plate that has a pattern corresponding to the outer peripheral area and in which a protection member is provided at a position that corresponds to a corner portion located between two sides of the plurality of sides, the two sides extending in directions that intersect with each other; and sealing, with the encapsulant, the solar cell element on which the coating is printed.

12 Claims, 14 Drawing Sheets

(51) Int. Cl.
*H01L 31/18* (2006.01)
*H01L 31/048* (2014.01)
*H01L 31/05* (2014.01)
*H01L 31/054* (2014.01)
*H01L 31/0203* (2014.01)

(52) U.S. Cl.
CPC ........ *H01L 31/048* (2013.01); *H01L 31/0504* (2013.01); *H01L 31/054* (2014.12); *H01L 31/0547* (2014.12); *H01L 31/18* (2013.01); *Y02E 10/52* (2013.01)

SOLAR CELL MODULE AND SOLAR CELL MODULE MANUFACTURING METHOD

RELATED APPLICATION

This Application is a Continuation of PCT/JP2014/003954, filed on Jul. 28, 2014, which in turn claims priority to Japanese Patent Application No. 2013-204127, filed on Sep. 30, 2013, the entire content of which is incorporated herein by reference.

BACKGROUND

1. Field of the Invention

The present invention relates to solar cell modules and solar cell module manufacturing methods.

2. Description of the Related Art

Due to manufacturing processes, an invalid area can be provided on a light-receiving surface, which is a light-incident surface, of a solar cell that is unlikely to contribute to the generation of electricity even when light is incident on an area located at the outer periphery of the light-receiving surface. In a solar cell in which such an invalid area is provided, a structure has been suggested where a light diffusion sheet is provided on the invalid area so as to effectively utilize incident light by diffusing light that is incident on the invalid area.

SUMMARY

In order to effectively utilize light, a structure is desirably employed that allows light incident on an invalid area such as the one described above to be more effectively scattered toward an area that contributes to the generation of electricity.

In this background, a purpose of the present invention is to provide a technology for improving the efficiency of the generation of electricity of a solar cell module.

One embodiment of the present invention relates to a solar cell module manufacturing method. This method includes: preparing a solar cell element that has a surface whose outer periphery is surrounded by a plurality of sides, an encapsulant that seals the solar cell elements, and a coating that has light diffusivity; applying the coating in an outer peripheral area of the surface via a printing plate that has a pattern corresponding to the outer peripheral area and in which a protection member is provided at a position that corresponds to a corner portion located between two sides of the plurality of sides, the two sides extending in directions that intersect with each other; and sealing, with the encapsulant, the solar cell element on which the coating is printed.

Another embodiment of the present invention relates to a solar cell module. This solar cell module includes: a solar cell element that has a surface whose outer periphery is surrounded by a plurality of sides; a light diffusion portion that is provided in an outer peripheral area of the surface; and an encapsulant that covers the top of the surface and the light diffusion portion. The light diffusion portion is provided avoiding a corner portion located between two sides of the plurality of sides, the two sides extending in directions that intersect with each other.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

The invention will now be described by reference to the preferred embodiments. This does not intend to limit the scope of the present invention, but to exemplify the invention.

Hereinafter, an embodiment for carrying out the present invention will be described in detail with reference to the accompanying drawing. In the explanation of the figures, like numerals represent like constituting elements, and duplicative explanations will be omitted appropriately.

Figure 1:
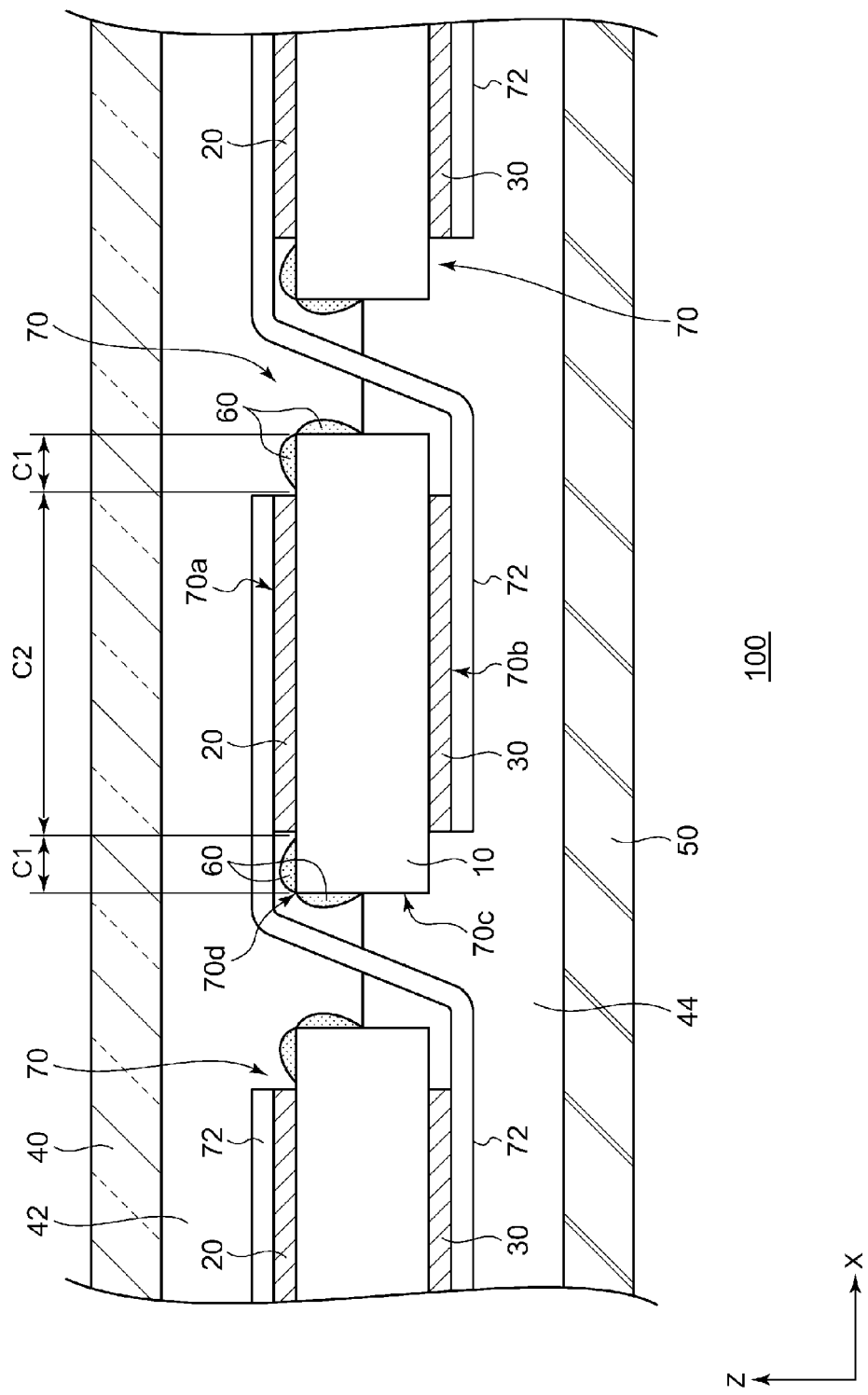
FIG. 1 is a cross-sectional view illustrating a structure of a solar cell module according to an embodiment.
Figure 2:
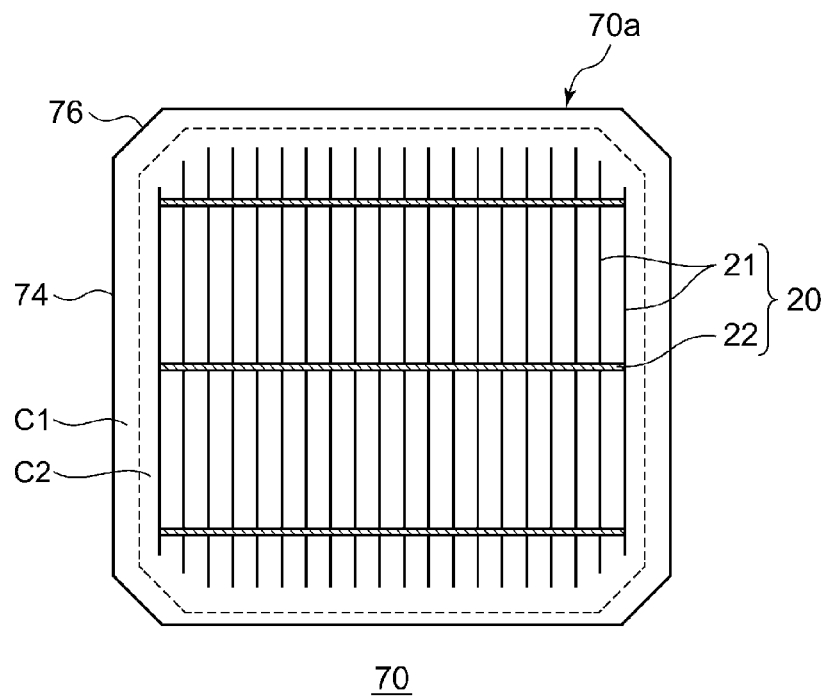
FIG. 2 is an exterior view illustrating a light-receiving surface of a solar cell element according to the embodiment.

FIG. 1 is a cross-sectional view illustrating a structure of a solar cell module 100 according to an embodiment. FIG. 2 is an external view illustrating a light-receiving surface 70a of a solar cell element 70.

The solar cell module 100 according to the present embodiment is provided with: a plurality of solar cell elements 70; a light diffusion portion 60 provided in an outer peripheral area C1 of a light-receiving surface 70a, which is one of the surfaces of a solar cell element 70; and tab wiring 72 that connects adjacent solar cell elements 70 with each other. In the solar cell element 70, a part of a semiconductor layer that constitutes an electricity generation layer 10 is not formed in the outer peripheral area C1 of the light-receiving surface 70a in order to prevent a short circuit between a semiconductor layer on the side of the light-receiving surface 70a and a semiconductor layer on the side of a back surface 70b in the course of manufacturing the electricity generation layer 10. Therefore, the outer peripheral area C1 is an invalid area that is unlikely to contribute to the generation of electricity even when light becomes incident.

The light diffusion portion 60 has light diffusivity for diffusing light that is incident on the light-receiving surface 70a and scatters incident light that is heading to the outer peripheral area C1 so that the light that is scattered heads to a valid area C2, which contributes to the generation of electricity, of the solar cell element 70. The light diffusion portion 60 is raised to form a convex surface with a gentle curvature. Thus, the light diffusion portion 60 is capable of effectively scattering incident light that is heading to the outer peripheral area C1. This allows light that is to be absorbed in the invalid area to be reflected so that the light is absorbed in the valid area C2 so as to contribute to the generation of electricity, and the efficiency of the generation of electricity of the solar cell element 70 can be improved compared to a case where the light diffusion portion 60 is not provided.

The solar cell module 100 is provided with a plurality of solar cell elements 70. A solar cell element 70 is provided with an electricity generation layer 10, a first metal electrode 20, and a second metal electrode 30.

The electricity generation layer 10 is a layer that absorbs incident light so as to generate photovoltaic power and has a substrate made of a semiconductor material, for example, crystalline silicon, gallium arsenide (GaAs), indium phosphide (InP), or the like. The structure of the electricity generation layer 10 is not particularly limited. In the present embodiment, the electricity generation layer 10 has a heterojunction between an n-type monocrystalline silicon substrate and non-crystalline silicon. In the electricity generation layer 10, for example, an i-type non-crystalline silicon layer, a p-type non-crystalline silicon layer on which boron (B) or the like is doped, and a transparent conductive layer made of a translucent conductive oxide such as an indium oxide are layered in said order on the side of a light-receiving surface of the n-type monocrystalline silicon substrate. An i-type non-crystalline silicon layer, an n-type non-crystalline silicon layer on which phosphorous (P) or the like is doped, and a transparent conductive layer are layered in said order on the side of a back surface of the substrate.

The electricity generation layer 10 has a light-receiving surface 70a, which is one surface of the solar cell element 70, and a back surface 70b, which is one surface of the solar cell element 70 and is opposed to the light-receiving surface 70a at the back. The light-receiving surface means a principal surface on which sunlight mainly becomes incident in the solar cell element 70 and, specifically, a surface on which the major portion of light that enters the electricity generation layer 10 becomes incident. As shown in FIG. 2, the light-receiving surface 70a in the present embodiment has an octagonal shape that is formed of four sides 74 and corner portions 76 at the four corners whose corners are cut off.

A part of a semiconductor layer that constitutes the electricity generation layer 10 is not formed in the outer peripheral area C1 of the light-receiving surface 70a. More specifically, an area in which an i-type non-crystalline silicon layer and a p-type non-crystalline silicon layer that are formed on an n-type crystalline silicon substrate are not provided represents the outer peripheral area C1, and an area in which these layers are provided represents the valid area C2. By providing the outer peripheral area C1, the intrusion and attachment, on a side surface 70c of the solar cell element 70, of both the p-type non-crystalline silicon layer on the light-receiving surface side and the n-type non-crystalline silicon layer on the back surface side that result in the generation of a short-circuit state can be prevented in a process of forming the electricity generation layer 10.

The first metal electrode 20 and the second metal electrode 30 are electrodes used to take out electricity generated by the electricity generation layer 10. The first metal electrode 20 is provided on the light-receiving surface 70a of the solar cell element 70, and the second metal electrode 30 is provided on the back surface 70b that faces the light-receiving surface 70a. The first metal electrode 20 and the second metal electrode 30 are conductive materials containing, for example, copper (Cu) or aluminum (Al). The first metal electrode 20 and the second metal electrode 30 may contain an electrolytic plating layer of copper (Cu), tin (Sn), or the like. However, the examples given are non-limiting. Other metals such as gold, silver, and the like, other conductive materials, or a combination of those may be used.

As shown in FIG. 2, the first metal electrode 20 is provided with a plurality of finger electrodes 21 extending parallel to one another and three bus bar electrodes 22 extending perpendicularly to the finger electrodes 21. The finger electrodes 21 are formed on the valid area C2. Thus, the finger electrodes 21 are desirably formed thinly so that light entering the electricity generation layer 10 is not blocked.

The bus bar electrodes 22 connect the plurality of finger electrodes 21 with one another. The bus bar electrodes 22 need to be formed thin enough not to block light entering the electricity generation layer 10 and thick enough to allow the electricity collected from the plurality of finger electrodes 21 to flow efficiently.

In the same way as in the first metal electrode 20, the second metal electrode 30 is also provided with a plurality of finger electrodes extending parallel to one another and three bus bar electrodes extending perpendicularly to the finger electrodes. Since the back surface 70b is not a principle surface on which sunlight mainly becomes incident, the electricity collection efficiency may be increased by increasing the number of finger electrodes on the side of the back surface 70b than that on the side of the light-receiving surface 70a.

Reference is made to FIG. 1 again. The light diffusion portion 60 is formed of a material having light diffusivity for diffusing light having a wavelength that is absorbed by the solar cell element 70. Having light diffusivity means to have the property of reflecting light that is incident on the light diffusion portion 60 mainly by diffuse reflection instead of specular reflection. The light diffusion portion 60 is formed of a material having an electrical insulation property. For example, an insulating white material in which particles of titania ($TiO_2$), alumina ($Al_2O_3$), or the like are dispersed in a resin substrate such as an epoxy resin, an acrylic resin, or the like is used as the light diffusion portion 60 having such a property. Therefore, the light diffusion portion 60 has electrical conductivity that is lower than that of the first metal electrode 20 and has light diffusivity that is higher than that of the first metal electrode 20. The light diffusion portion 60 needs to have a thickness that is enough to be able to sufficiently scatter incident light. The thickness may be set to be 3 μm or greater and 100 μm or less. For example, the thickness may be set to be around 20 μm to 30 μm.

The light diffusion portion 60 is formed to have a convex surface shape with a gentle curvature where the light diffusion portion 60 is raised in relation to the light-receiving surface 70*a* so as to be able to effectively scatter incident light that is heading to the outer peripheral area C1. The light diffusion portion 60 is formed to cover at least a part of a side surface 70*c* so as to be able to scatter incident light that is heading to the side surface 70*c* of the solar cell element 70. By providing the light diffusion portion 60 on both the light-receiving surface 70*a* and the side surface 70*c*, a curved surface having various inclinations with respect to incident light can be formed. Thus, light that is incident on the light diffusion portion 60 can be effectively scattered. The light diffusion portion 60 is formed such that the light diffusion portion 60 avoids a corner 70*d* formed by the light-receiving surface 70*a* and the side surface 70*c*. By forming the light diffusion portion 60 while avoiding the corner 70*d*, the amount of a resin material that is necessary for the formation of the light diffusion portion 60 can be reduced compared to a case where the light diffusion portion 60 is provided while covering the corner 70*d*.

Figure 3:
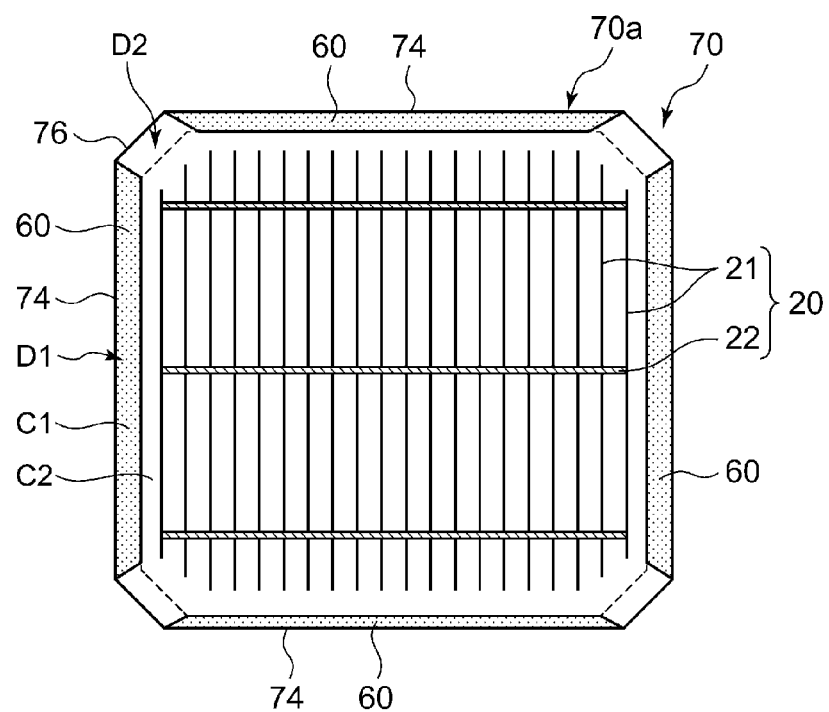
FIG. 3 is a diagram illustrating a light diffusion portion provided in an outer peripheral area of the solar cell element according to the embodiment.

FIG. 3 is a diagram illustrating the light diffusion portion 60 provided in the outer peripheral area C1 of the solar cell element 70. Avoiding a second area D2 located along a corner portion 76, the light diffusion portion 60 is provided only in a first area D1 located along a side 74 in the outer peripheral area C1. In other words, the light diffusion portion 60 is provided while avoiding a second area D2 located between two sides 74 that extend in directions intersecting with each other. The light diffusion portion 60 may be provided such that the light diffusion portion 60 sticks out into an area that is adjacent to the outer peripheral area C1 in the valid area C2 instead of being provided only in an area that corresponds to the outer peripheral area C1.

Reference is made to FIG. 1 again. The solar cell module 100 is provided with tab wiring 72 that connects adjacent solar cell elements 70 with each other. The tab wiring 72 is an elongated metallic foil, and, for example, a copper foil coated with silver is used. An end of the tab wiring 72 is connected to a first metal electrode 20 of a solar cell element 70, and the other end thereof is connected to a second metal electrode 30 of another solar cell element 70 that is connected to the solar cell element 70.

The solar cell module 100 is provided with a protection substrate 40, a back sheet 50, a first encapsulant 42, and a second encapsulant 44. The protection substrate 40 and the back sheet 50 protect the solar cell element 70 from the external environment. Also, the protection substrate 40 that is provided on the side of the light-receiving surface 70*a* transmits light having a wavelength region that is absorbed by the solar cell element 70 for the generation of electricity. The protection substrate 40 is, for example, a glass substrate. The back sheet 50 is a resin substrate of EVA, polyimides, or the like or a glass substrate as in the case of the protection substrate 40.

The first encapsulant 42 and the second encapsulant 44 are resin materials such as EVA, polyamides, or the like. This prevents, e.g., the infiltration of moisture to a power generation layer of the solar cell module 100 and also improves the overall strength of the solar cell module 100.

A white resin material in which particles of titania or the like are dispersed may be used for the second encapsulant 44 on the side of the back surface 70*b*. This allows light that has passed through the solar cell element 70 and then reached the second encapsulant 44 to be scattered so that the light heads to the solar cell element 70 again.

An explanation will be given now regarding an example of the manufacturing method of the solar cell module 100.

Figure 4:
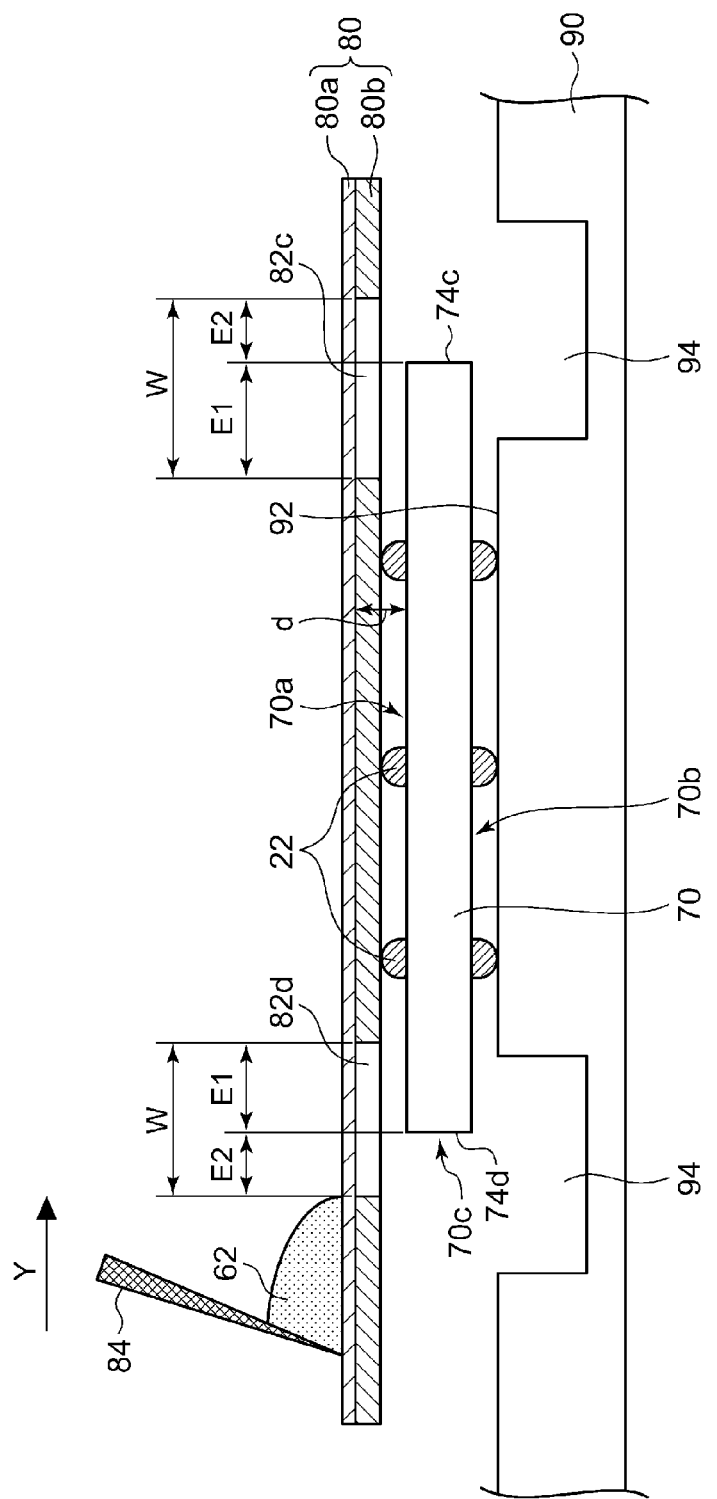
FIG. 4 is a diagram illustrating a process of applying, by screen printing, a light diffusion portion according to the embodiment.

FIG. 4 is a diagram illustrating a process of applying a light diffusion portion 60 by screen printing according to the embodiment. The solar cell element 70 is placed on a stage 90 on which a groove 94 is provided. Then, the printing plate 80 having the openings 82*c* and 82*d* is placed on the light-receiving surface 70*a* of the solar cell element 70, and the squeegee 84 is moved in a Y direction. Thereby, a coating 62 is applied on the light-receiving surface 70*a* via the printing plate 80. After finger electrodes and bus bar electrodes 22 are formed on the light-receiving surface 70*a* of the solar cell element 70, the coating 62 is applied by moving the squeegee 84 in the Y direction in which the finger electrodes extend. Also, by applying the coating 62 after the bus bar electrodes 22 are provided, a distance d can be kept between the light-receiving surface 70*a* and the mesh 80*a* in comparison with a case where there is no bus bar electrode 22, and the thickness of the coating 62 can be increased.

The printing plate 80 has a mesh 80*a* made of metal and an emulsion 80*b* placed in accordance with the pattern of the printing plate 80. An area in which the emulsion 80*b* is provided is an area in which the coating 62 is not applied, and areas W in which the emulsion 80*b* is not provided correspond to the openings 82*c* and 82*d* of the printing plate 80. The open areas W are provided such that the respective outer peripheries of the open areas W are larger than those of respective application areas E1 on the light-receiving surface 70*a*, and the open areas W lie across both the respective application areas E1 and respective extended areas E2, which are provided to surround the respective outer peripheries of the application areas E1. By providing an opening in areas corresponding to the extended areas E2, the coating 62 can be also applied to the respective side surfaces 70*c*.

Figure 5:
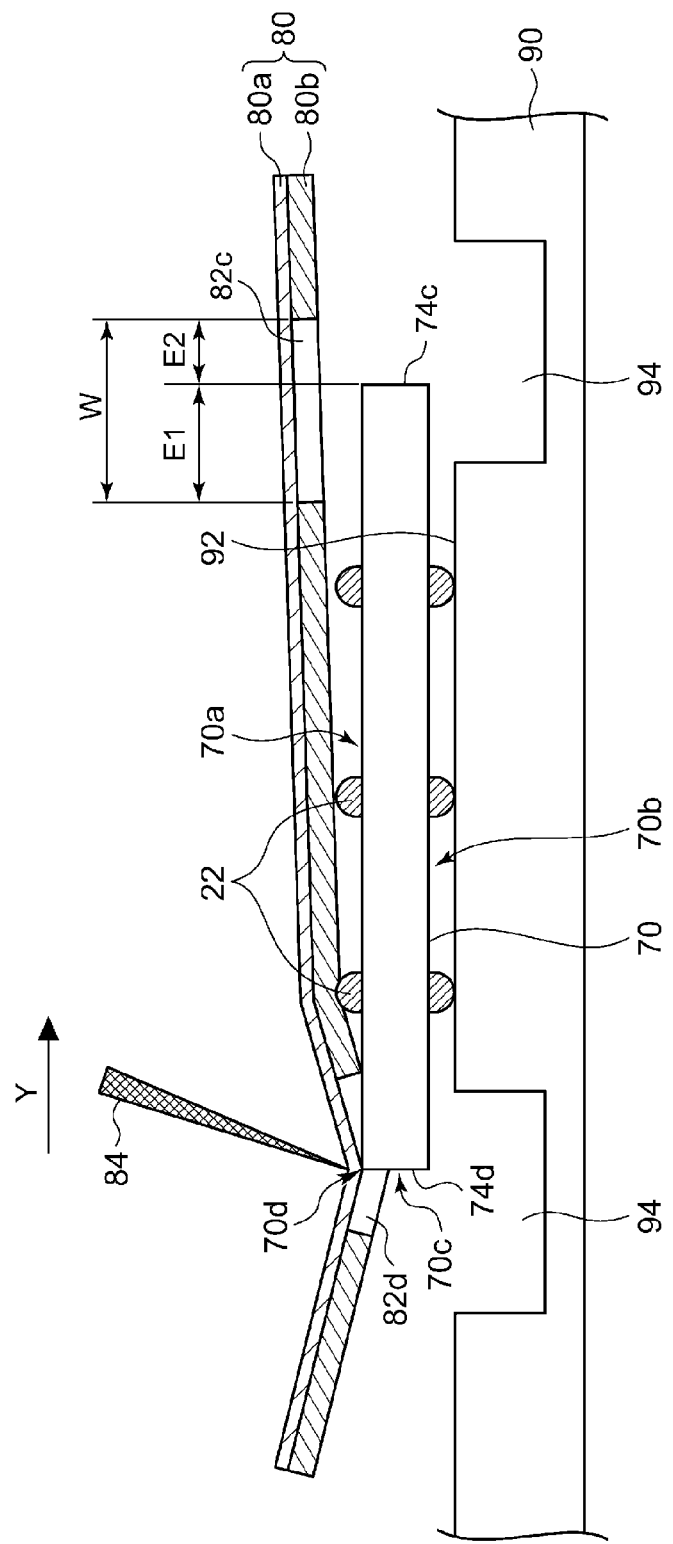
FIG. 5 is a diagram illustrating a problem that lies in a process of applying, by screen printing, a light diffusion portion according to the embodiment.

FIG. 5 is a diagram illustrating a problem that lies in a process of applying a light diffusion portion by screen printing according to the embodiment. In the present embodiment, the outer periphery of an open area W of a printing plate 80 is provided to be larger than the outer periphery of a light-receiving surface 70*a*. Thus, a mesh 80*a* of the printing plate 80 comes in contact with a corner 70*d* of a solar cell element 70 in a process of screen printing. In particular, since the corner 70*d*, which corresponds to a corner portion 76 of the solar cell element 70, extends at an angle with respect to the direction Y in which the squeegee 84 is moved, force of pressing the mesh 80*a* exerted by the squeegee 84 becomes concentrated, and the mesh 80*a* is thus damaged easily.

In the present embodiment, a coating 62 is applied by using a printing plate 80 in which an emulsion 80*b* is provided in an area that corresponds to the corner portion 76. By protecting a part of the mesh 80*a* that is easily damaged throughout the process of screen printing by using the emulsion 80*b*, the durability of the printing plate 80 can be increased, and the same printing plate 80 can be used repeatedly in the printing process. By increasing the durability of the printing plate 80, failure in application caused by damage of the printing plate 80 can be prevented.

Figure 6:
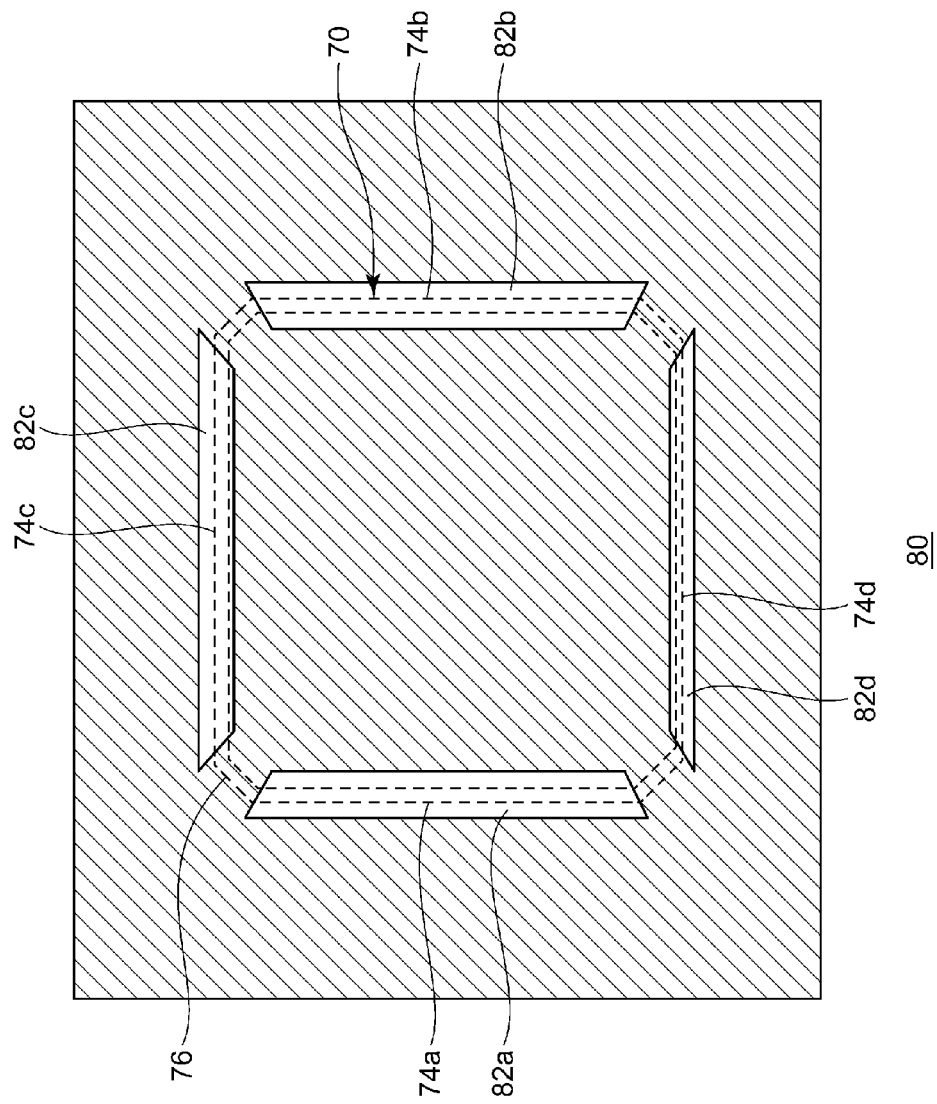
FIG. 6 is a diagram illustrating a printing plate that is used for the application of the light diffusion portion according to the embodiment.

FIG. 6 is a diagram illustrating the printing plate 80 that is used for the application of the light diffusion portion according to the embodiment. As shown in the figure, the printing plate 80 has openings 82*a* through 82*d* in respective areas corresponding to four sides 74*a* through 74*d*, respectively. On the other hand, no opening is provided in respective areas corresponding to four corner portions 76, and an emulsion is provided as a protection member so that a mesh does not come into contact with a corner 70*d* of a solar cell element 70. In the figure, dashed lines show respective positions corresponding to the outer periphery of the solar cell element 70 and a borderline between an outer peripheral area and a valid area, respectively.

Figure 7:
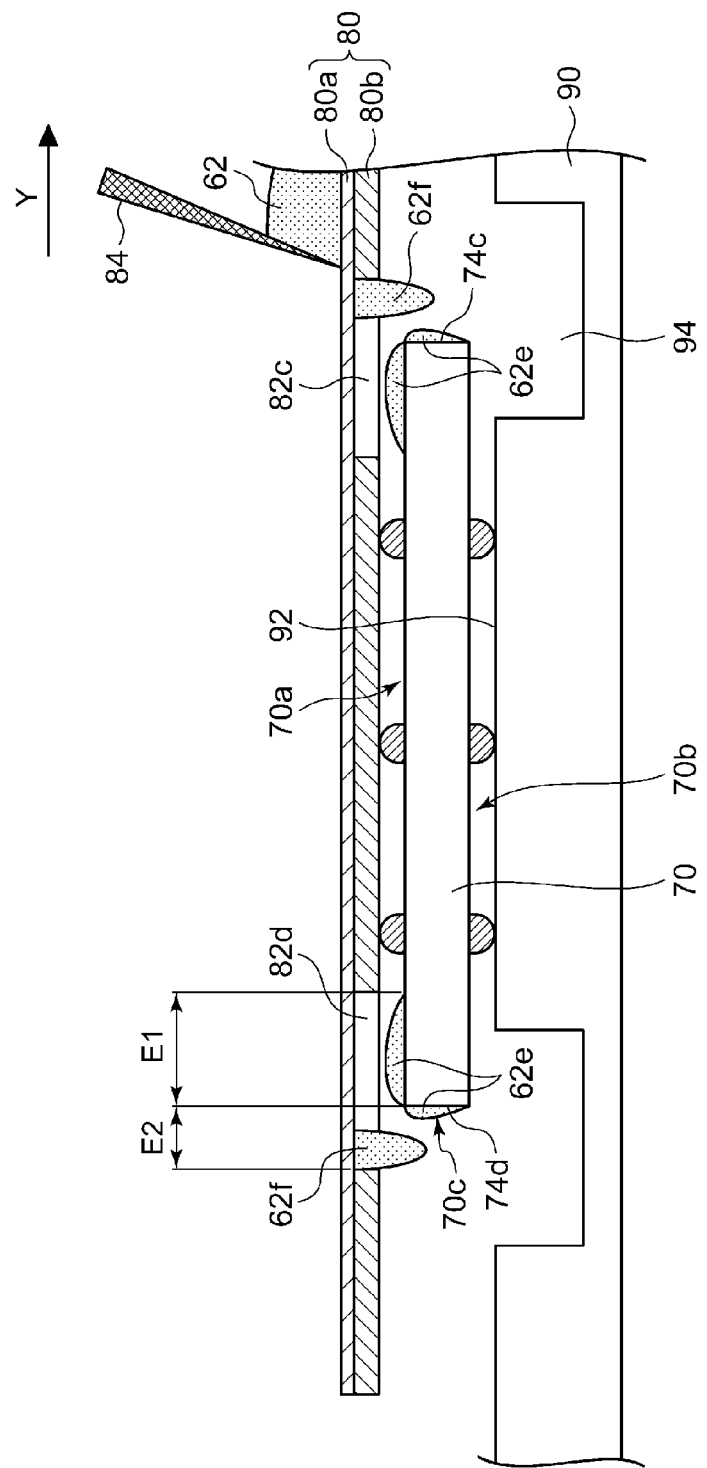
FIG. 7 is a diagram illustrating a process of applying, by screen printing, a light diffusion portion according to the embodiment.

FIG. 7 is a diagram illustrating a process of applying the light diffusion portion 60 by screen printing according to the embodiment. By applying a coating 62 via the printing plate 80 shown in FIG. 6, a coating 62e is applied in the outer peripheral area corresponding to the four sides of the solar cell element 70. On the other hand, the coating 62 is not applied in the outer peripheral area corresponding to the four corner portions.

Since the solar cell element 70 is not provided under the extended areas E2, coatings 62f that are pushed out by the squeegee 84 are easily accumulated at respective positions corresponding to the extended areas E2. Using these coatings 62f that have been accumulated, the coatings 62f can be thickly applied to the respective side surfaces 70c. However, if the solar cell element 70 is placed on a flat stage, the coatings 62f may become attached to the stage. In that case, the stage and the solar cell element 70 are bonded to each other by the coatings, and there is a possibility of breakage due to application of stress to the solar cell element 70 when picking up the solar cell element 70 from the stage. Thus, the stage 90 in which the groove 94 is provided at a position corresponding to the outer periphery of the solar cell element 70 is used. This allows for the prevention of the attachment of the coating 62 to the stage 90.

Then, a light diffusion portion 60 is formed by hardening the coating 62e applied by screen printing.

After the solar cell element 70 on which the light diffusion portion 60 is formed is connected by the tab wiring 72, the first encapsulant 42 and the protection substrate 40 are placed on the side of the light-receiving surface 70a, and the second encapsulant 44 and the back sheet 50 are placed on the back surface 70b. The solar cell element 70 is then thermocompression-bonded while the solar cell element 70 is sandwiched between the protection substrate 40 and the back sheet 50. This allows the first encapsulant 42 and the second encapsulant 44 to be fused, forming the solar cell module 100 shown in FIG. 1.

An explanation will be given in the following regarding effects achieved by a light diffusion portion 60 according to the present embodiment.

Figure 8:
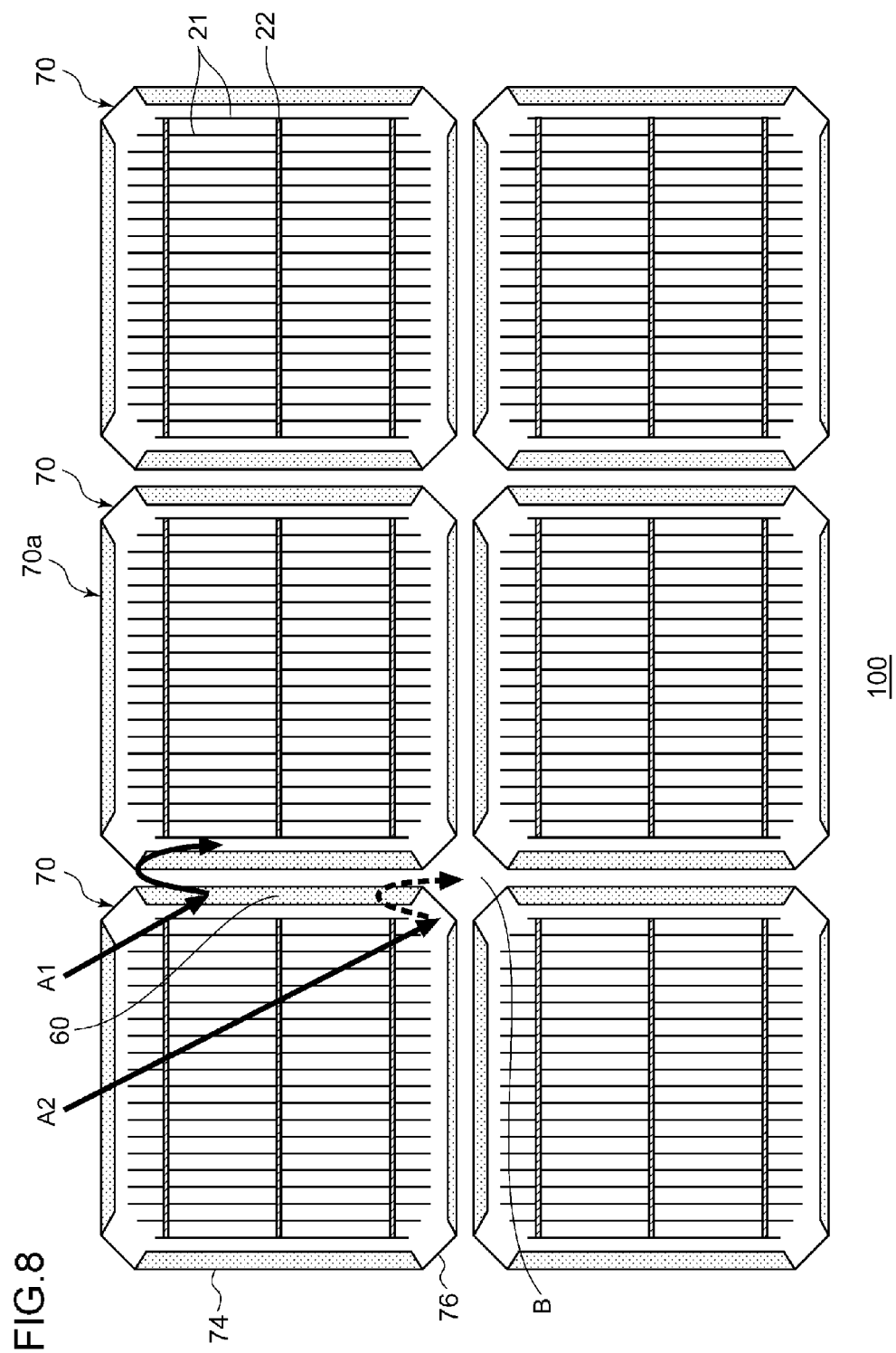
FIG. 8 is a diagram illustrating a state where incident light is scattered by a light diffusion portion according to the embodiment.

FIG. 8 is a diagram illustrating a state where incident light is diffused by a light diffusion portion 60 according to the embodiment. This figure illustrates a light-receiving surface 70a of the solar cell module 100, and the plurality of solar cell elements 70 are arranged side by side in a direction in which the finger electrodes 21 extend and in a direction in which the bus bar electrodes 22 extend. A side 74 of a solar cell element 70 is arranged such that the side 74 faces a side 74 of another adjacent solar cell element 70. Meanwhile, respective corner portions 76 of four closely-provided solar cell elements 70 form a blank area B in which no solar cell element 70 is provided.

Light A1 that is incident on a light diffusion portion 60 provided along a side 74 is diffused by the light diffusion portion 60. Then, the light A1 is all reflected at an interface of the protection substrate 40 of the solar cell module 100 and thereby becomes incident again on a light-receiving surface 70a of a solar cell element 70. The position at which the light becomes incident again is near where the light A1 has become incident on the light diffusion portion 60 at this time. Thus, the light A1 that has become incident on the light diffusion portion 60 becomes incident again in a valid area adjacent to the light diffusion portion 60 and contributes to the generation of electricity. A blank area B is not provided near a side 74. Thus, by providing a light diffusion portion 60 on a side 74, light incident on the light diffusion portion 60 can be scattered in a valid area, allowing for the contribution to the generation of electricity.

On the other hand, since a corner portion 76 is adjacent to a blank area B, a portion of light A2 that is incident on a light diffusion portion provided along the corner portion 76 becomes incident again in the blank area B. In that case, the amount of electricity generation may be lowered compared to a case where light is incident in an outer peripheral area C1, which is a case that can contribute to the generation of electricity even though the efficiency of the generation of electricity is low. In the present embodiment, the efficiency of the generation of electricity can be increased by not providing a light diffusion portion along a corner portion 76.

In a solar cell module 100 according to the present embodiment, the outer peripheral edge of a solar cell element 70 can be protected by providing a light diffusion portion 60 in an outer peripheral area C1 of a light-receiving surface 70a and on side surfaces 70c. Also, by providing a light diffusion portion 60 along four sides 74, a structure can be realized that is strong against force applied in a direction in which a light-receiving surface 70a of a solar cell element 70 bends. Further, since a light diffusion portion 60 is provided around a corner 70d of a solar cell element 70, a structure can be realized that is strong against impact applied to the corner 70d by protecting the corner 70d.

The present invention has been described by referring to each of the above-described embodiments. However, the present invention is not limited to the above-described embodiments only, and those resulting from any combination of them as appropriate or substitution are also within the scope of the present invention. Further, the combination of the embodiments or the process sequence thereof may be appropriately set or various modifications in design may be added to the embodiments based on the knowledge of the person skilled in the art. An embodiment having such modifications may be also included in the scope of the invention.

Figure 9:
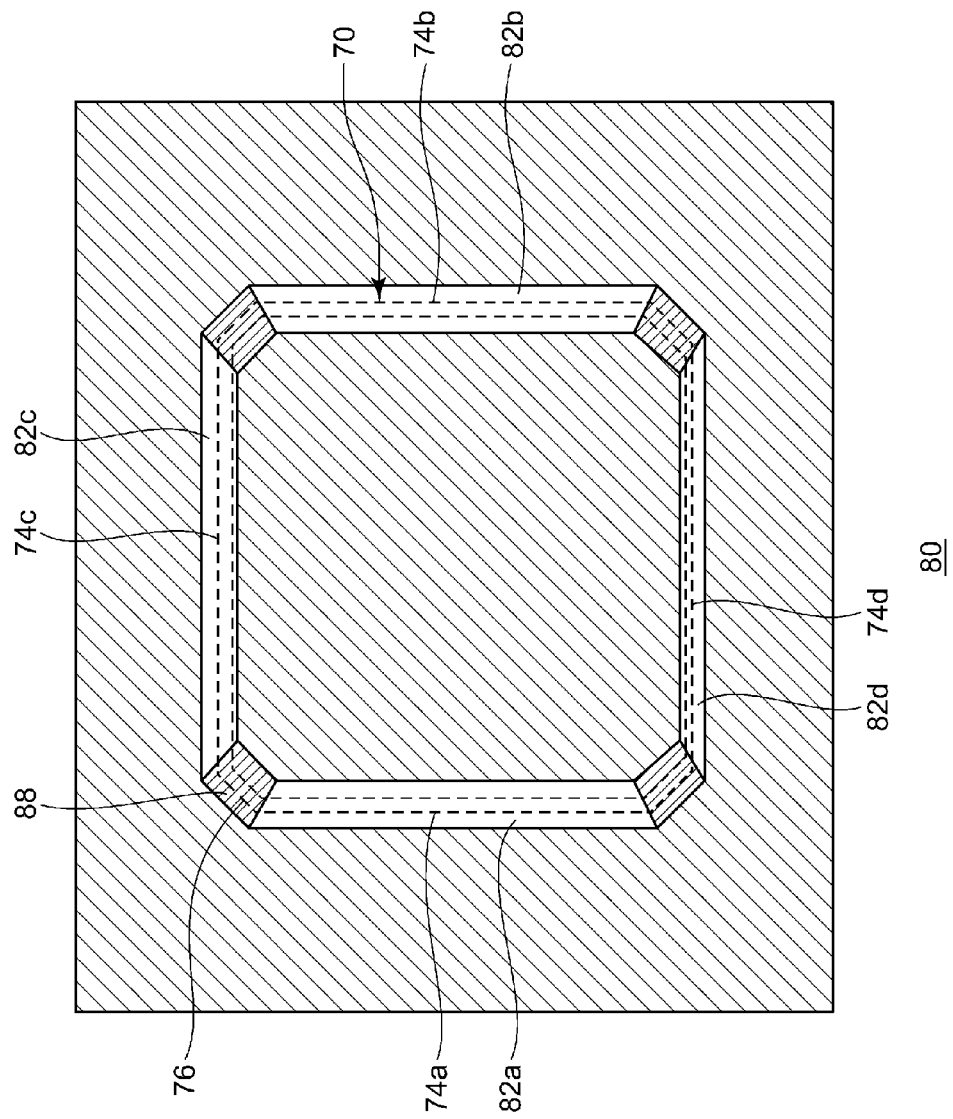
FIG. 9 is a diagram illustrating a printing plate according to a first exemplary variation.

FIG. 9 is a diagram illustrating a printing plate 80 according to a first exemplary variation. The printing plate 80 according to the first exemplary variation is different from that according to the above-stated embodiment in that a reinforcing portion 88 for protecting an area that corresponds to a corner portion 76 is provided. The reinforcing portion 88 is a protection member for reinforcing a mesh of the printing plate 80 and is formed of, for example, a metal foil or the like. The durability of the printing plate 80 can be further enhanced by providing the reinforcing portion 88.

Figure 10:
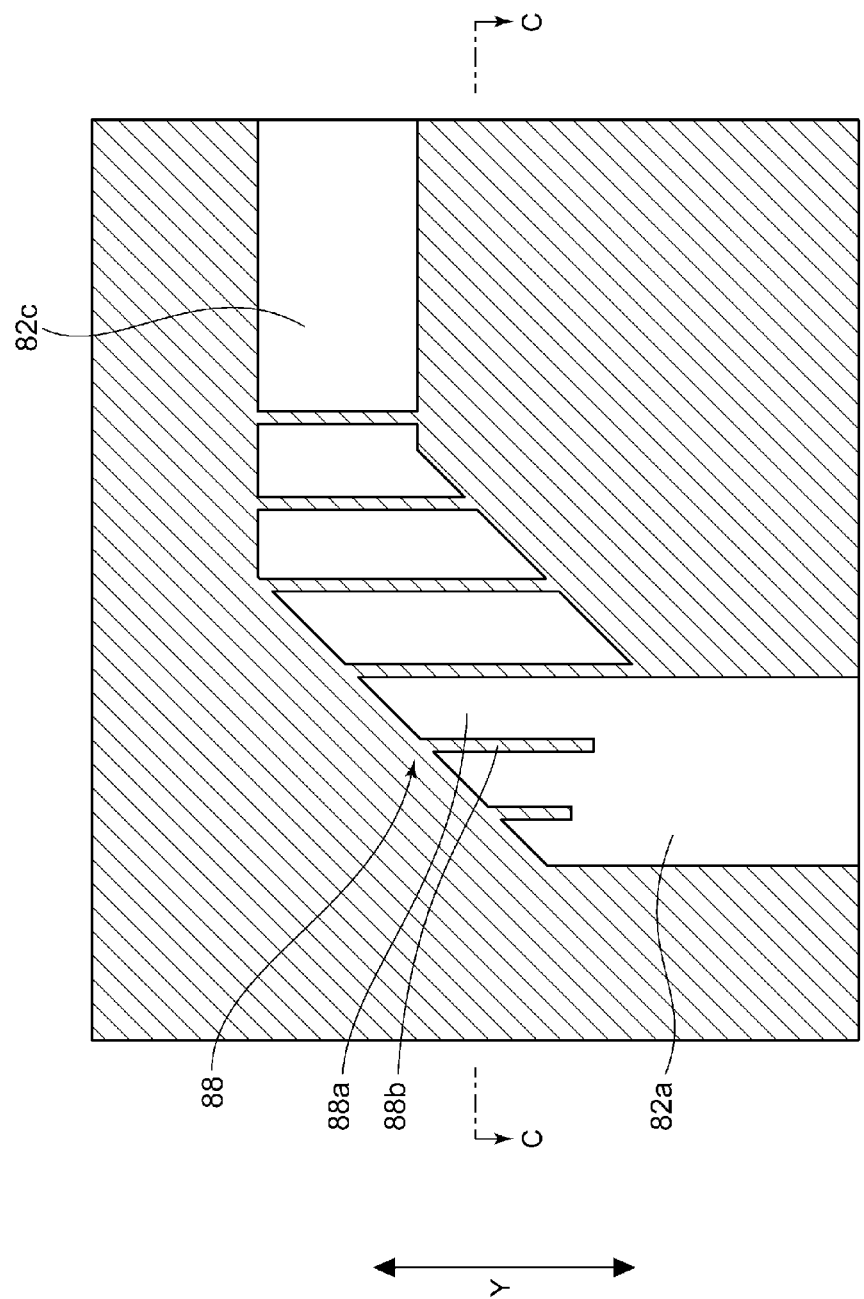
FIG. 10 is a diagram illustrating a printing plate according to a second exemplary variation.

FIG. 10 is a diagram illustrating a printing plate 80 according to a second exemplary variation. In the printing plate 80 according to the second exemplary embodiment, a plurality of reinforcing lines 88b that extend along a direction Y for screen printing are provided as a reinforcing portion 88 for protecting an area that corresponds to a corner portion 76. By providing reinforcing lines 88b that are arranged in stripes and that extend in the Y direction, the durability against pressing force applied by a squeegee that moves in the Y direction can be enhanced. An area in which the reinforcing lines 88b are not provided in the area corresponding to the corner portion 76 represents an opening 88a, and a coating is applied therein by printing.

Figure 11:
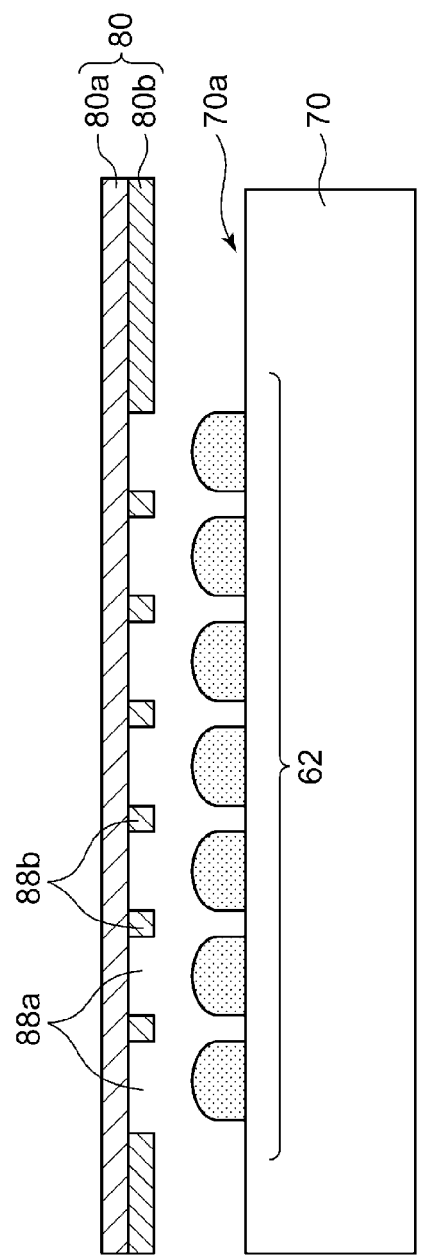
FIG. 11 is a diagram illustrating a process of applying a coating via the printing plate according to the second exemplary variation.

FIG. 11 is a diagram illustrating a process of applying a coating 62 via the printing plate 80 according to the second exemplary variation and is a diagram schematically illustrating the coating 62 applied in an area that corresponds to a corner portion of a solar cell element 70. By using the printing plate 80 on which the reinforcing lines 88b are provided in stripes, the coating 62 is applied in stripes on a light-receiving surface 70a.

Figure 12:
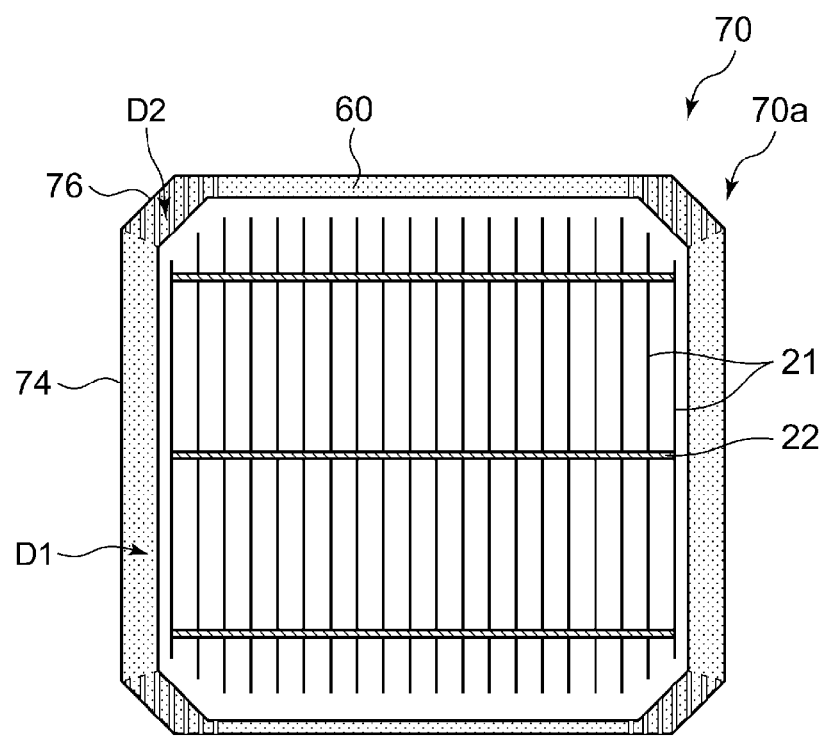
FIG. 12 is a diagram illustrating a light diffusion portion according to the second exemplary variation.

FIG. 12 is a diagram illustrating a light diffusion portion 60 according to the second exemplary variation. As shown in the figure, the light diffusion portion 60 is provided such that the light diffusion portion 60 covers a first area D1 corresponding to a side 74 and such that the light diffusion portion 60 covers a portion of a second area D2 corresponding to a corner portion 76. The light diffusion portion 60 is provided such that a stripe pattern that extends along finger electrodes 21 is formed in the second area D2 corresponding to the corner portion 76. By providing the light diffusion portion 60 in this manner, the efficiency of the generation of electricity can be increased by diffusing light that becomes incident on a corner portion 76. Also, the durability of the printing plate can be increased, and the manufacturing cost can be lowered.

Figure 13:
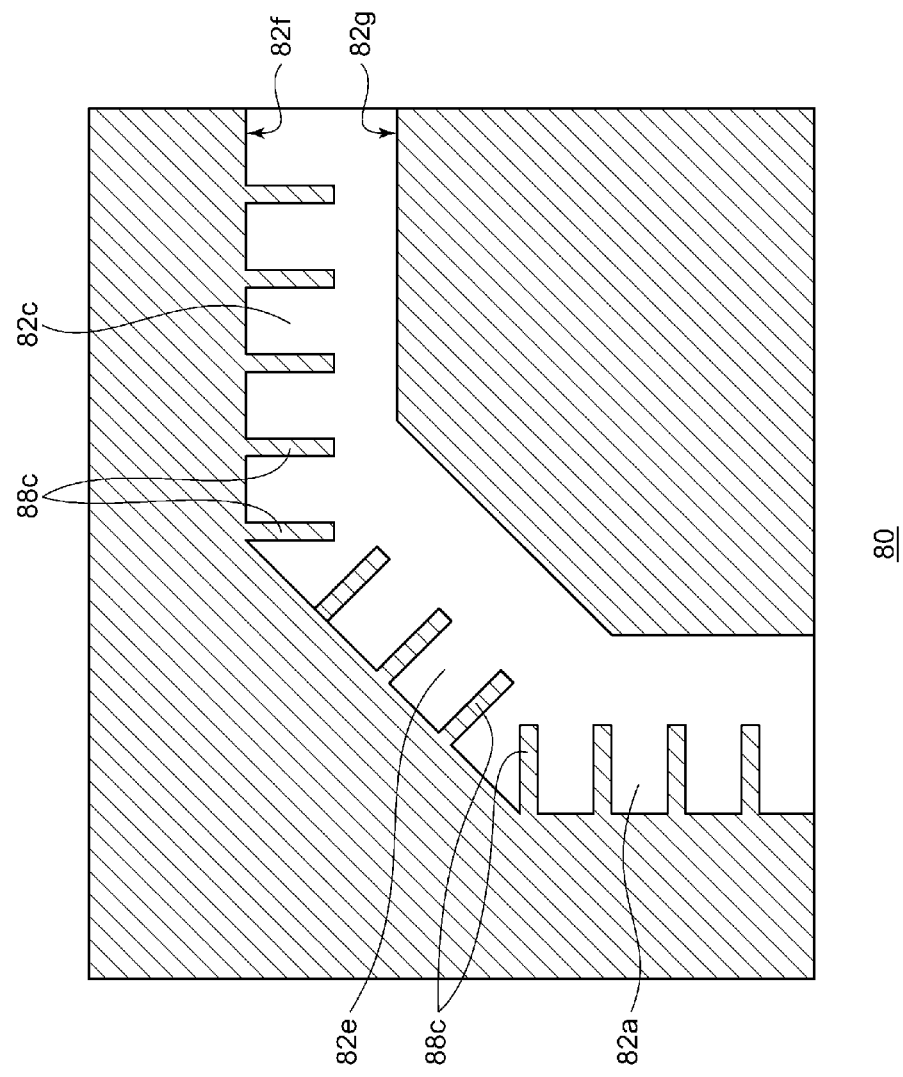
FIG. 13 is a diagram illustrating a printing plate according to a third exemplary variation.

FIG. 13 is a diagram illustrating a printing plate 80 according to a third exemplary variation. In the printing plate 80 according to the third exemplary embodiment, an opening 82e is provided in an area that corresponds to a corner portion 76, and reinforcing lines 88c are provided in openings 82a and 82c that correspond to sides 74 and in the opening 82e that corresponds to the corner portion 76. The reinforcing lines 88c are provided on the side of an outer peripheral edge 82f while avoiding the side of an inner peripheral edge 82g in the openings 82a, 82c, and 82e. The reinforcing lines 88c are provided such that the reinforcing lines 88c extend in a direction that intersects with the outer peripheral edge 82f. Thereby, the reinforcing lines 88c are provided on the side of the outer peripheral edge 82f where a corner 70d of a solar cell element 70 is easily touched, and the durability against pressing force applied by a squeegee can be enhanced. By not providing the reinforcing lines 88c on the side of the inner peripheral edge 82g, an area in which the light diffusion portion 60 is provided can be prevented from being narrow. As another exemplary variation, a printing plate where the reinforcing lines 88c extend to the inner peripheral edge 82g from the outer peripheral edge 82f may be used.

Figure 14:
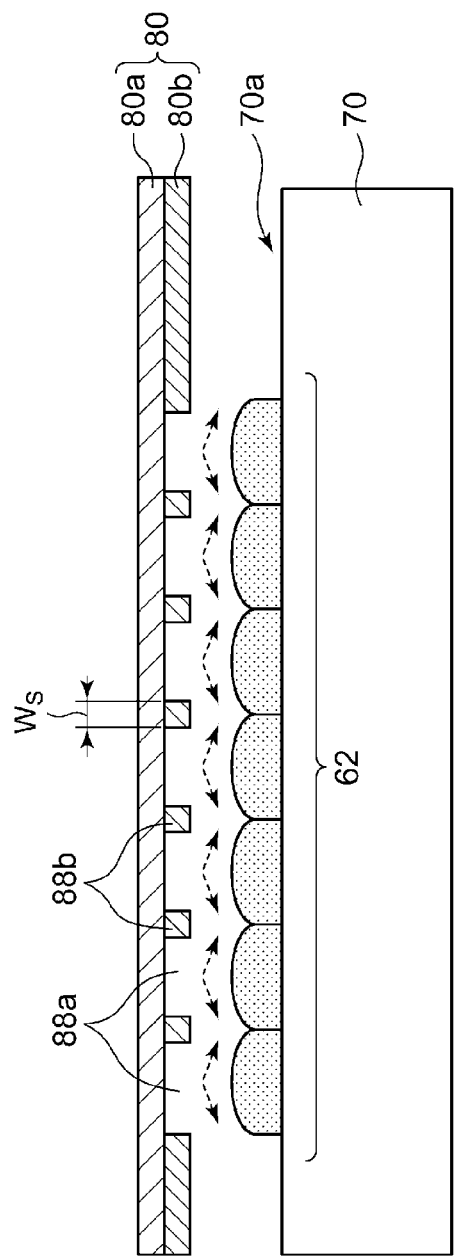
FIG. 14 is a diagram illustrating a process of applying a coating via a printing plate according to a fourth exemplary variation.

FIG. 14 is a diagram illustrating a process of applying a coating 62 via a printing plate 80 according to a fourth exemplary variation. The printing plate 80 according to the fourth exemplary variation has a structure that is similar to that according to the second exemplary variation. By selecting a coating 62 of low viscosity, the coating 62 arranged on a light-receiving surface 70a via openings 88a spreads peripherally such that the coating 62 fills in gaps that correspond to reinforcing lines 88b. Thereby, even in a case of a printing plate 80 that has reinforcing lines 88b, the coating 62 can be applied on the entire surface of an area that corresponds to a corner portion 76. The width $W_s$ of the reinforcing lines 88b is desirably set to be narrow at this time so that gaps that correspond to the reinforcing lines 88b can be filled in. For example, the width $W_s$ may be set to be around 50 μm depending on the properties of a coating 62 that is used.

Figure 15:
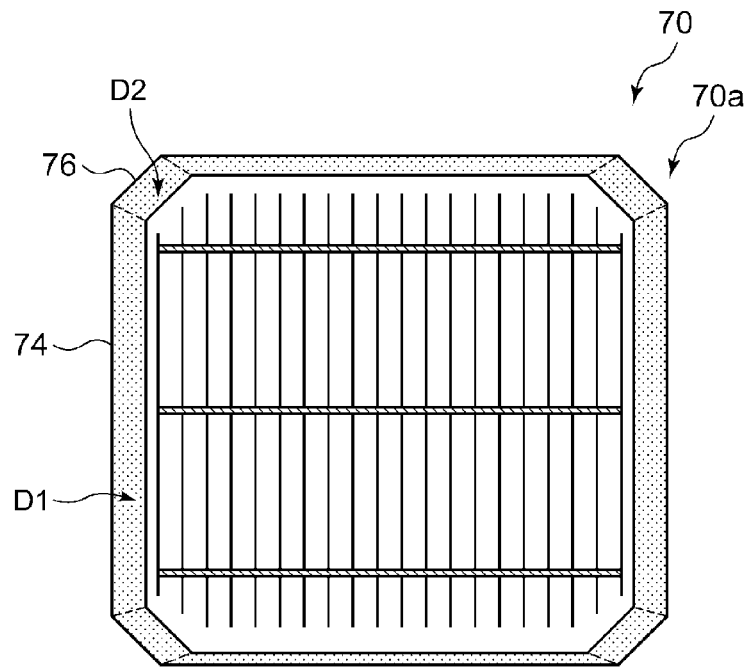
FIG. 15 is a diagram illustrating a light diffusion portion according to the fourth exemplary variation.

FIG. 15 is a diagram illustrating a light diffusion portion 60 according to the fourth exemplary variation. As shown in the figure, the light diffusion portion 60 is provided such that the light diffusion portion 60 covers a first area D1 corresponding to a side 74 and such that the light diffusion portion 60 covers the entire surface of a second area D2 corresponding to a corner portion 76. By providing the light diffusion portion 60 in this manner, the appearance can be improved. By providing the light diffusion portion 60 on the entire surface of the corner portion 76, the efficiency of the generation of electricity can be increased by diffusing light that becomes incident near the corner portion 76. Also, the durability of a printing plate that is used for printing can be increased, and the manufacturing cost can be lowered.

Figure 16:
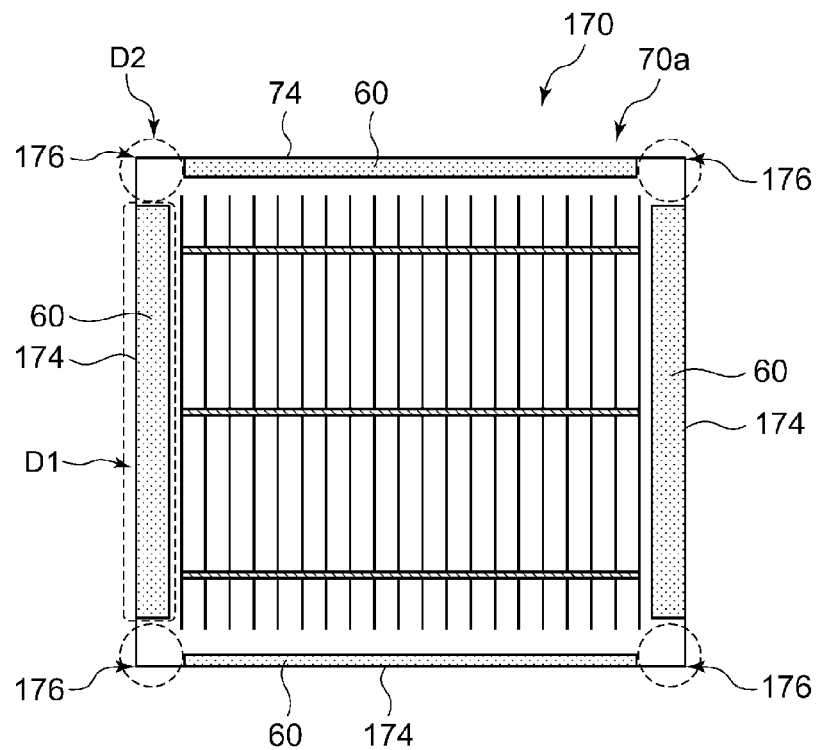
FIG. 16 is a diagram illustrating a light diffusion portion according to a fifth exemplary variation.

FIG. 16 is a diagram illustrating a solar cell element 170 and light diffusion portions 60 according to a fifth exemplary variation. Different from those according to the above-stated embodiments and exemplary variations, a solar cell element 170 according to the fifth exemplary variation has a rectangular shape where the outer periphery is surrounded by four sides 174. While being provided in respective first areas D1 along the sides 174, a light diffusion portion 60 is provided avoiding a second area D2 corresponding to an area near a corner portion 176 where adjacent sides 174 come into contact with each other. In other words, the light diffusion portion 60 is provided while avoiding a second area D2 located between two sides 174 that extend in directions intersecting with each other. As a printing plate used for forming such a light diffusion portion 60, a printing plate is used in which openings that correspond to sides 174 are provided and in which a protection member is provided in an area that corresponds to a corner portion 176. By using a printing plate in which a protection member is provided in an area that corresponds to a corner portion 176, damage caused to a mesh of the printing plate by the corner portion 176 of the solar cell element 170 touching the mesh can be prevented.

As another exemplary variation, a light diffusion portion may be provided avoiding a corner portion located between adjacent sides when the surface of a solar cell element has another polygonal shape such as a triangular shape or a hexagonal shape. As a printing plate for providing such a light diffusion portion, a printing plate may be used in which a protection member is provided at a position that corresponds to a corner portion. Thereby, a position that corresponds to the corner portion, which is a part of the printing plate that can be easily damaged, can be protected, and the durability of the printing plate can be increased. Also, by increasing the durability of the printing plate, failure in application can be prevented from being caused.

In the above-described embodiments, a light diffusion portion 60 is provided such that the light diffusion portion 60 avoids a corner 70d formed by a light-receiving surface 70a and a side surface 70c of a solar cell element 70. However, in another exemplary variation, a light diffusion portion 60 may be provided such that the light diffusion portion 60 covers a corner 70d.

In the above-described embodiment, a coating 62, which serves as a light diffusion portion 60, is applied after a bus bar electrode 22 is formed. In another exemplary variation, a light diffusion portion 60 may be formed before a bus bar electrode 22 is formed, and the bus bar electrode 22 may be then formed.

One embodiment is as shown in the following. A method of manufacturing a solar cell module 100 according to one embodiment includes:

preparing a solar cell element 70 that has a surface whose outer periphery is surrounded by a plurality of sides 74, encapsulants 42 and 44 that seal the solar cell elements 70, and a coating 62 that has light diffusivity;

applying a coating 62e in an outer peripheral area C1 of the surface via a printing plate 80 that has a pattern corresponding to the outer peripheral area C1 and in which a protection member is provided at a position that corresponds to a corner portion 76 located between two sides of the plurality of sides 74, the two sides extending in directions that intersect with each other; and sealing the solar cell element 70, on which the coating 62e is printed, by the encapsulants 42 and 44.

The coating 62 may be applied by screen printing.

Another embodiment relates to a solar cell module 100. This solar cell module 100 includes:

a solar cell element 70 that has a surface whose outer periphery is surrounded by a plurality of sides 74;

a light diffusion portion 60 that is provided in an outer peripheral area C1 of the surface; and encapsulants 42 and 44 that cover the top of the surface and the light diffusion portion 60, wherein the light diffusion portion 60 is provided avoiding a corner portion 76 located between two sides of the plurality of sides 74, the two sides extending in directions that intersect with each other.

The surface may have an octagonal shape in which four corners of a rectangular shape surrounded by four sides 74 are cut off. Avoiding a corner portion 76 whose corner is cut off, the light diffusion portion 60 may be provided in an area located along a side 74.

The light diffusion portion 60 may be provided avoiding a partial area of the corner portion 76.

It should be understood that the invention is not limited to the above-described embodiment, but may be modified into various forms on the basis of the spirit of the invention. Additionally, the modifications are included in the scope of the invention.

What is claimed is:

1. A solar cell module manufacturing method comprising:
    applying a coating material in an outer peripheral area of a surface of a solar cell element via a printing plate; and
    sealing the solar cell element, which has the coating material thereon, with an encapsulant material, wherein:
    the printing plate has a frame shape opening having four corner areas,
    each of the four corner areas includes a reinforcing portion, and
    the four corner areas are provided at a position that corresponds to corner portions of the solar cell element, the each of the corner portions being located between two sides of a plurality of sides of the solar cell element, the two sides extending in directions that intersect with each other.

2. The solar cell module manufacturing method according to claim 1, wherein:
    the coating material is applied by screen printing, and
    the printing plate comprises a metal mesh and an emersion layer provided on the metal mesh.

3. The solar cell module manufacturing method according to claim 1, wherein:
    the reinforcing portion comprises multiple thin line portions, and
    the multiple thin line portions have a width 50 micron meters or less.

4. The solar cell module manufacturing method according to claim 1, wherein a shape of the coating material provided on the solar cell is different from a shape of the opening provided on the printing plate in a plan view.

5. The solar cell module manufacturing method according to claim 1, wherein the coating material includes resin and further includes titanium oxide or aluminum oxide.

6. The solar cell module manufacturing method according to claim 1, wherein:
    the solar cell element further comprises side surfaces as a thickness of the solar cell, and
    the coating material is provided on a part of the side surfaces.

7. The solar cell module manufacturing method according to claim 1, wherein the coating material is not provided on a corner that is made from the surface of the solar cell and the side surface of the solar cell.

8. The solar cell module manufacturing method according to claim 4, wherein the coating material has such a viscosity that allows a difference between the shape of the coating material provided on the solar cell and the shape of the frame shape opening provided on the printing plate in a plan view.

9. The solar cell module manufacturing method according to claim 1, wherein:
    after applying the coating material via the printing plate, the printing plate is removed from the solar cell element, and
    after the printing plate is removed, the coating material spreads such that the coating material forms a continuous shape without a gap.

10. The solar cell module manufacturing method according to claim 2, wherein the reinforcing portion is made of the metal mesh and the emersion layer.

11. The solar cell module manufacturing method according to claim 1, wherein a thickness of coating material corresponding to the reinforcing portion is relatively thinner than an average thickness of the coating material.

12. The solar cell module manufacturing method according to claim 1, wherein:
    the solar cell element further comprises a bus bar electrode, and
    a thickness of the coating material is thinner than a thickness of the bus bar electrode.

* * * * *